United States Patent
Lin et al.

(10) Patent No.: US 9,158,638 B2
(45) Date of Patent: Oct. 13, 2015

(54) MEMORY CONTROLLING METHOD

(75) Inventors: Yung-Lun Lin, Taipei (TW); Chuan-Te Chang, Taipei (TW); Nan-Kun Lo, Taipei (TW)

(73) Assignee: ASUSTeK COMPUTER INC., Taipei (TW)

(*) Notice: Subject to any disclaimer, the term of this patent is extended or adjusted under 35 U.S.C. 154(b) by 957 days.

(21) Appl. No.: 12/868,014

(22) Filed: Aug. 25, 2010

(65) Prior Publication Data

US 2011/0055618 A1    Mar. 3, 2011

(30) Foreign Application Priority Data

Aug. 26, 2009  (TW) .............................. 98128654 A

(51) Int. Cl.
| | |
|---|---|
| *G06F 13/00* | (2006.01) |
| *G06F 1/00* | (2006.01) |
| *G06F 11/22* | (2006.01) |
| *G11C 29/02* | (2006.01) |
| *G11C 5/04* | (2006.01) |

(52) U.S. Cl.
CPC .............. *G06F 11/2284* (2013.01); *G06F 1/00* (2013.01); *G06F 13/00* (2013.01); *G11C 29/022* (2013.01); *G11C 29/028* (2013.01); *G11C 5/04* (2013.01)

(58) Field of Classification Search
USPC .............. 713/500, 501, 503; 702/79, 85, 106; 711/170
See application file for complete search history.

(56) References Cited

U.S. PATENT DOCUMENTS

| | | | | |
|---|---|---|---|---|
| 6,016,282 | A * | 1/2000 | Keeth ........................ | 365/233.13 |
| 6,434,081 | B1 * | 8/2002 | Johnson et al. .......... | 365/233.14 |
| 6,606,041 | B1 * | 8/2003 | Johnson et al. ............... | 341/120 |
| 6,691,214 | B1 * | 2/2004 | Li et al. ......................... | 711/167 |
| 6,735,709 | B1 * | 5/2004 | Lee et al. ....................... | 713/401 |
| 6,999,887 | B2 | 2/2006 | Rehm et al. | |
| 7,043,652 | B2 * | 5/2006 | Matsui ........................... | 713/400 |
| 7,646,835 | B1 * | 1/2010 | Rozas ............................ | 375/354 |
| 2005/0119849 | A1 * | 6/2005 | Jeddeloh ...................... | 702/107 |
| 2006/0015776 | A1 | 1/2006 | Lee | |
| 2007/0008791 | A1 * | 1/2007 | Butt et al. ...................... | 365/193 |
| 2008/0098253 | A1 * | 4/2008 | Lee et al. ....................... | 713/503 |
| 2009/0327789 | A1 * | 12/2009 | Zerbe et al. ................... | 713/400 |

FOREIGN PATENT DOCUMENTS

CN          1797360 A        7/2006

* cited by examiner

*Primary Examiner* — Khanh Dang
(74) *Attorney, Agent, or Firm* — Muncy, Geissler, Olds & Lowe, P.C.

(57) ABSTRACT

A memory controlling method adapted for driving a memory within a computer system is disclosed. When the computer system is booted, the memory is driven and tested via the BIOS. The memory controlling method performs tests on multiple controlling signals of the memory. The memory controlling method includes steps of: detecting an active window of each controlling signal; determining whether the active windows is larger than a predetermined window; performing a parameter adjustment on the controlling signals if one of the active windows is smaller than the predetermined window; performing a phase range test between two of the control signals if the active windows are larger than the predetermined window; performing a phase adjustment on the active windows of the controlling signals if the controlling signals fails in the phase range test; and driving the memory according to the adjusted controlling signals.

16 Claims, 3 Drawing Sheets

MEMORY CONTROLLING METHOD

CROSS REFERENCE TO RELATED APPLICATIONS

This Non-provisional application claims priority under 35 U.S.C. §119(a) on Patent Application No(s). 098128654 filed in Taiwan, Republic of China on Aug. 26, 2009, the entire contents of which are hereby incorporated by reference.

BACKGROUND OF THE INVENTION

1. Field of Invention

The invention relates to a memory controlling method and, more particularly, to a controlling method for setting memory parameters using a test command in the basic input/output system (BIOS).

2. Related Art

With the fast development of components in computers, there are multiple kinds of memory modules in the market both for sale and customization. The memory specification varies along with the different manufacturers, gains, and different released time. When the memories are produced, the memory manufacturers and system assembling manufacturers should determine the stable working environment of each memory such as the working voltage configuration, driving strength, a delay time reference, an active window of the memory and so on. The memory needs the optimum settings to read, write and store data with the highest stableness. Since the initial settings set by the memory manufacturers may not satisfy the criterion or the requirement of the system assembling manufacturer, the memory needs to be finely adjusted and tested by the system testing engineers or the research and development engineers to get the optimum settings of the memories.

Taking a personal computer as an example, the motherboard usually has BIOS to initialize the memory module and perform the power on self test (POST). The BIOS usually stores a large lookup table for looking up the environment condition settings for each kind of memory.

However, with the innovation of semiconductor processing, the memory is developed from the synchronous dynamic random access memory (SDRAM) to double-data-rate three (DDR3) SDRAM, and the memory has different specifications. The time span in developing new product is shorter and shorter. Every time the memory brings out, the electronic product needs to be adjusted again for making the memory work stably. Therefore, the manufacturers need to pay a lot for designing and manufacturing, and the user also may feel inconvenient in practical usage.

SUMMARY OF THE INVENTION

The invention discloses a memory controlling method adapted to driving the memory in the controlling signal. The memory is driven by multiple controlling signals. When a computer system is booted, the controlling signals are driven and tested via the BIOS in the memory controlling method.

According to an embodiment of the invention, the memory controlling method comprising the steps of: (a) detecting an active window of each controlling signal; (b) determining whether the active windows are larger than a predetermined window; (c) performing a parameter adjustment to the controlling signals if one of the active windows is smaller than the predetermined window; (d) performing a phase range test between two of the controlling signals according to the active windows when the active windows are larger than the predetermined window; (e) performing a phase adjustment on the active windows of two of the controlling signals when two of the controlling signals do not pass the phase range test; and (f) driving the memory according to the controlling signals adjusted in step (c) or (e).

That is, the memory controlling method of the invention can be performed via software or firmware in the BIOS. When the computer system is booted, the memory is tested and adjusted according to the controlling signals (such as the size of the active window and the phase of the signal), and the parameter or the phase of the controlling signal are adjusted automatically. Consequently, during the booting process of the computer system, parameters of the memory can be adjusted automatically to ensure that the memory module can work stably. As a result, and the situation that the memory cannot be driven would not happen, and the time for developing and manufacturing is also reduced.

These and other features, aspects and advantages of the present invention will become better understood with regard to the following description, appended claims, and accompanying drawings.

DETAILED DESCRIPTION OF THE INVENTION

Figure 1:
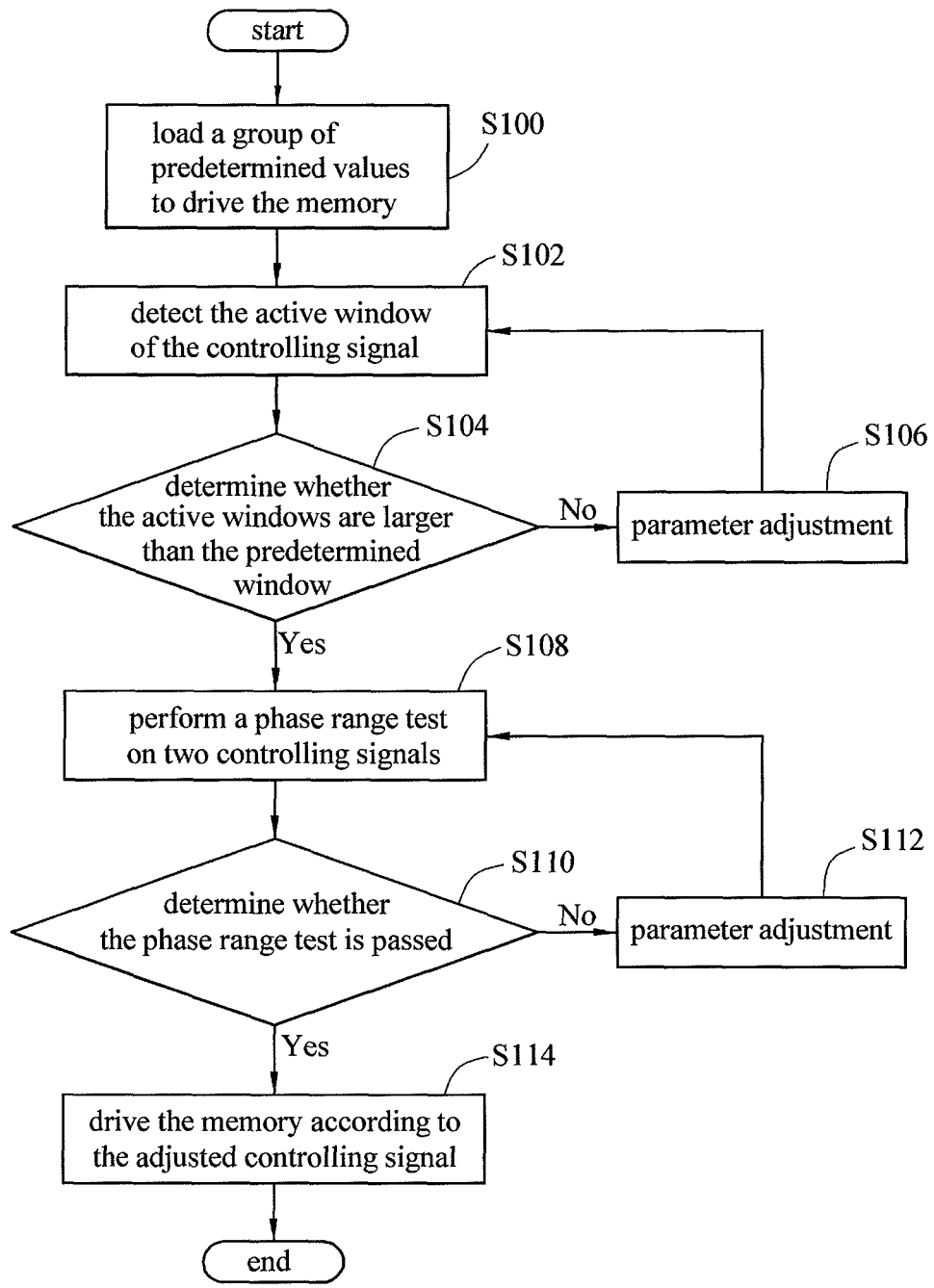
FIG. 1 is a flow chart showing the memory controlling method in an embodiment of the invention.
Figure 2:
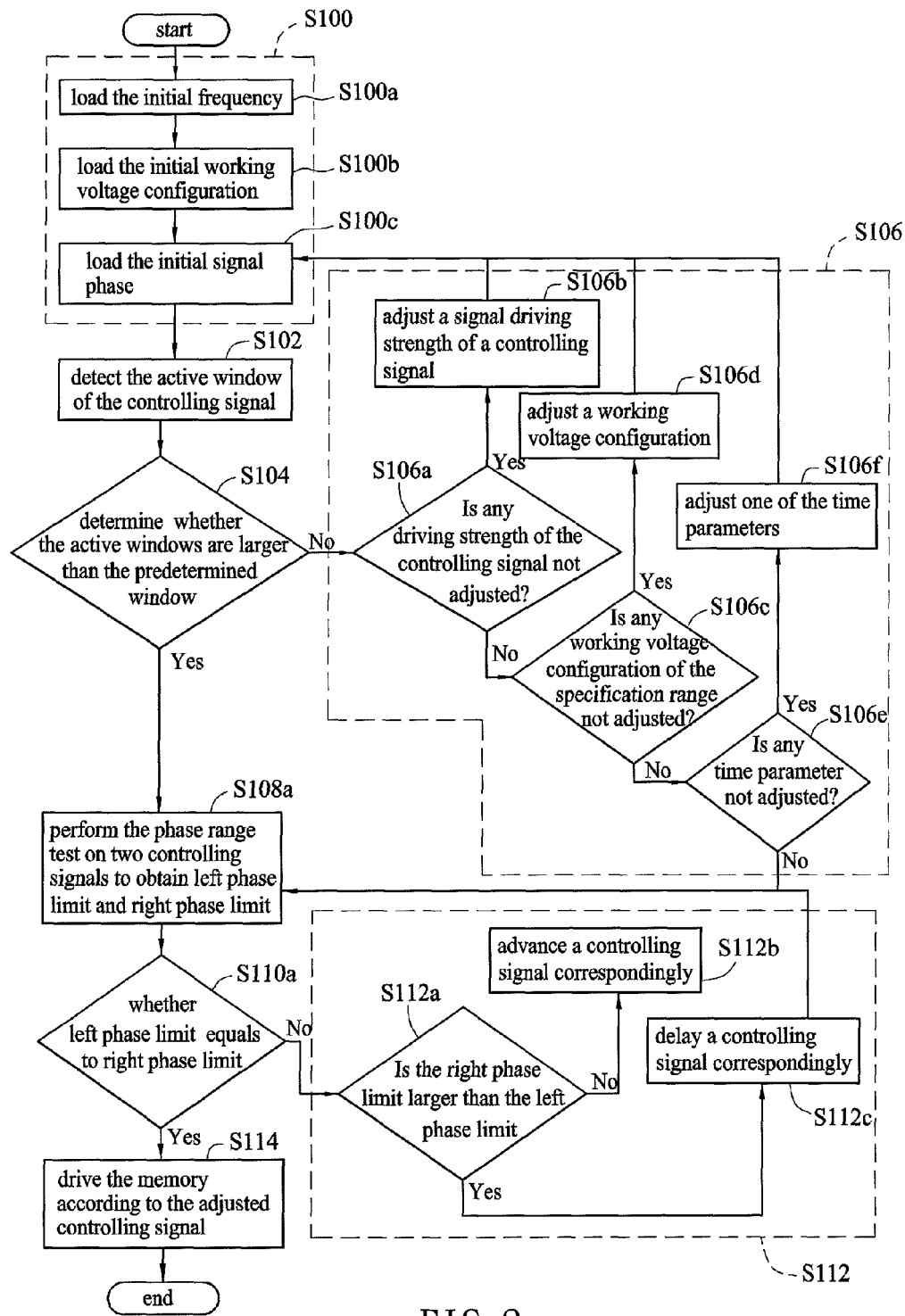
FIG. 2 is a detailed flow chart showing the memory controlling method in the embodiment of the invention.

FIG. 1 is a flow chart showing the memory controlling method in a first embodiment of the invention and FIG. 2 is a detailed flow chart showing the memory controlling method in the embodiment of the invention.

The memory controlling method in the invention is adapted to the memory in the computer system. When the computer system is booted, the driving program and the testing program in the BIOS are used to drive and test the memory, respectively, and the parameter in the memory are adjusted. The parameter in the memory is usually driven by the controlling signal. In practical usage, the controlling signals includes one or the combination of a command controlling signal (command, CMD), a clock controlling signal (Clock, CLK), a read controlling signal (Read DQ), a read clock controlling signal (Read DQS), a write controlling signal (Write DQ) and a write clock controlling signal (write DQS). The controlling signals define different states such as the minimum clock unit, the current executing task, the read and write operations, which are the controlling signals needed by the memory in operating.

Figure 3:
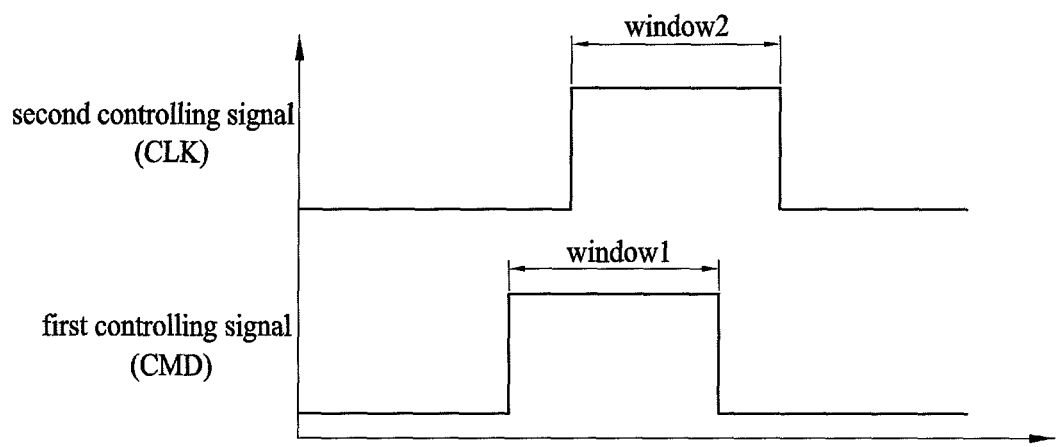
FIG. 3 is a schematic diagram showing the signal wave of the two controlling signals in an embodiment of the invention.

Each controlling signal has an active window. FIG. 3 is a schematic diagram showing the signal waves of the two controlling signals in a first embodiment of the invention. As shown in FIG. 3, the two controlling signals may be a first controlling signal (such as the clock controlling signal, Clock) and the second controlling signal (such as the command controlling signal, Command). The first controlling signal has an active window window 1, and the second controlling signal has an active window window 2. In practical usage, the active window of each controlling signal has a certain size to make the memory work normally.

FIG. 1 is a flow chart showing the memory controlling method in a first embodiment of the invention. As shown in FIG. 1, firstly, in step S100, a group of predetermined values is loaded to drive the memory. The step of loading the predetermined value may include several detailed steps. As shown in FIG. 2, in an embodiment of the invention, step S100 may include step S100a, step S100b and step S100c. In step S100a, an initial frequency such as a labeled frequency provided by the manufacturer is loaded to the memory. In step S100b, an initial working voltage setting is loaded to the memory. For example, in practical usage, the memory with DDR3 architecture may utilize 1.5V memory bus voltage, and the memory with Intel P55 platform may utilize 1.1V memory controller voltage. In step S100c, the controlling signals of the memory (such as the CMD CLK, Write DQ, Write DQS, Read DQ, Read DQS, CTRL) loads an initial signal phase to the memory. The operation of loading the predetermined value to drive the memory in step S100 is just simply enabling the basic function of the memory to facilitate the sequential adjustment, but, however, the memory may work unstably.

Loading the predetermined value in step S100 is familiar to the person with ordinary skills, and it may be achieved via the lookup table or static firmware, which is not illustrated herein for concise purpose.

Then, in the memory controlling method in the embodiment of the invention, step S102 is performed to detect the size of the active window of each controlling signal (such as the window 1 and window 2 in FIG. 3). The active window of the controlling signal herein is that the duration in which the controlling signal keeps in a certain operating voltage level when the controlling signal is set in the level (such as the high level representing the positive logic and the low level representing the negative logic) to control or drive the corresponding circuit module. For example, in FIG. 3, the controlling signals (CMD and CLK) are raised to the high level at the preset time point and enter the active window (the window 1 or the window 2) to control or drive the corresponding circuit.

In practical usage, to achieve higher calculation speed, the circuit usually has extremely high signal switching frequency. Consequently, the active window of the controlling signal becomes shorter and shorter. However, many electronic devices (such as a register and an operational amplifier) have their own non-ideal delay such as wiring delay or gate delay. If the active window of the controlling signal is too short, when the controlling signal passes through several logical circuits, the signal may be distorted or missed due to the components delay or the system clock asynchronism.

Then, step S104 is performed to determine whether the active window of the controlling signal is larger than a predetermined window. In the embodiment, the size of the predetermined window may be determined according to the window in which the memory can work stably in the practical test or the specific algorithm. If the active windows of the controlling signals are larger than the predetermined window, it means that the memory can operate stably.

On the contrary, if some active window of the controlling signal is smaller than the predetermined window, it means that the memory stays in the unstable state. At that moment, the memory controlling method in the embodiment of the invention may execute step S106, which is performing the parameter adjustment on the controlling signals.

As shown in FIG. 1 and FIG. 2, the step of parameter adjustment (step S106) may be achieved by several steps, for example, it may include a signal driving strength adjustment, a working voltage configuration adjustment and a time parameter adjustment steps.

In the embodiment in FIG. 2, when it is determined that the active window of the controlling signal is smaller than the predetermined window in step S104, and the parameter adjustment in step S106 is entered, in the memory controlling method in the embodiment of the invention, step S106b may be performed to adjust the signal driving strength of the controlling signal. The signal driving strength of the controlling signals such as the CMD, CLK, Write DQ, Write DQS, Read DQ, Read DQS, and CTRL may be adjusted. Then, the step S102 and S104 are performed to detect whether the active windows are larger than the predetermined window.

That is, the memory controlling method in the embodiment of the invention adjusts the signal driving strength of the controlling signal again until each active window is larger than the predetermined window or the signal driving strength of each controlling signal is adjusted.

Before step S106b is performed, the memory controlling method in the embodiment of the invention may further include step S106a, which is pre-determining whether the driving strength of each controlling signal is not adjusted. If the driving strength of each controlling signal is adjusted, and some active window of the controlling signals is still not larger than the predetermined window, the memory controlling method in the embodiment of the invention would automatically adjust other the parameters to increase the speed in determining the adjusting efficiency.

As shown in the second embodiment in FIG. 2, if the signal driving strength adjustment in S106a is finished, but the active window of some controlling signal is still smaller than the predetermined window, step S106d may be further performed to adjust the working voltage configuration of the memory. In practical usage, the working voltage configuration of the memory includes one or the combination of the memory bus voltage parameter and the memory controller voltage parameter. The parameters have their specification ranges, and if they exceed the ranges, the memory may be damaged or have error. For example, the specification range of the working voltage of the memory bus is 1.5V to 2V, and the voltage of the memory controller may be 1.1V to 1.5V. In step S106d, the working voltage configuration is adjusted in the specification range.

After adjustment, step S102 and S104 are performed to detect whether the adjusted active window is larger than the predetermined window. That is, in the memory controlling method in the embodiment of the invention, different working voltage configurations are adjusted again and again until every active window is larger than the predetermined window or every working voltage configuration in the specification range is adjusted.

In addition, as shown in FIG. 2, before step S106d is performed, the memory controlling method in the embodiment of the invention may further include step S106c to predetermine whether any working voltage configuration in the specification range is not adjusted. If all the parameters are adjusted, and some active window is still smaller than the predetermined window, the memory controlling method in the embodiment of the invention would automatically switch to adjust other parameters.

As shown in FIG. 2, if all the working voltage configurations are adjusted in step S106c, and some active window of the controlling signal is still smaller than the predetermined window, step S106f is further performed to adjust a time parameter in the memory. In practical usage, the time parameter of the memory may include multiple memory delay parameters, and the memory delay parameters includes one or the combination of time clock ($T_{CL}$), timing of RAS to CAS delay ($T_{RCD}$), timing of RAS precharge ($T_{RP}$) and active to RAS precharge delay ($T_{RAS}$). In practical usage, the memory delay parameter represents the time needed by the memory in each operating mode. When step S106f is performed, the time parameters of the memories are adjusted one by one.

Every time after the adjustment, step S102 and step S104 are performed to detect whether the adjusted active windows are larger than the predetermined window. That is, in the memory controlling method in the embodiment of the invention, different time parameters are adjusted until every active window is larger than the predetermined window or every time parameter is adjusted.

In addition, as shown in FIG. 2, before step S106f is performed, the memory controlling method in the embodiment of the invention may further include step S106e to predetermine whether any time parameter is not adjusted. If all the time parameters are adjusted, but there are still active windows smaller than the predetermined window, in the embodiment, other testing and adjusting processes are performed subsequently. However, the memory controlling method in the invention is not limited to the test and adjust on the signal driving strength, the working voltage configuration and the time parameters, and in other embodiments, more parameters can be adjusted. In addition, the order in determining the three tests is also not limited in the embodiment, and in other embodiments, the order may be changed or independent to each other.

In addition, in another embodiment, when all the time parameters are adjusted, but there are still some active window is not larger than the predetermined window, in the memory controlling method in the embodiment of the invention, an error signal is transmitted back or informs the designer or the user to redefine the predetermined standard value of the window for determining the active window. Subsequently, step S102 to S106 are performed again.

Figure 4:
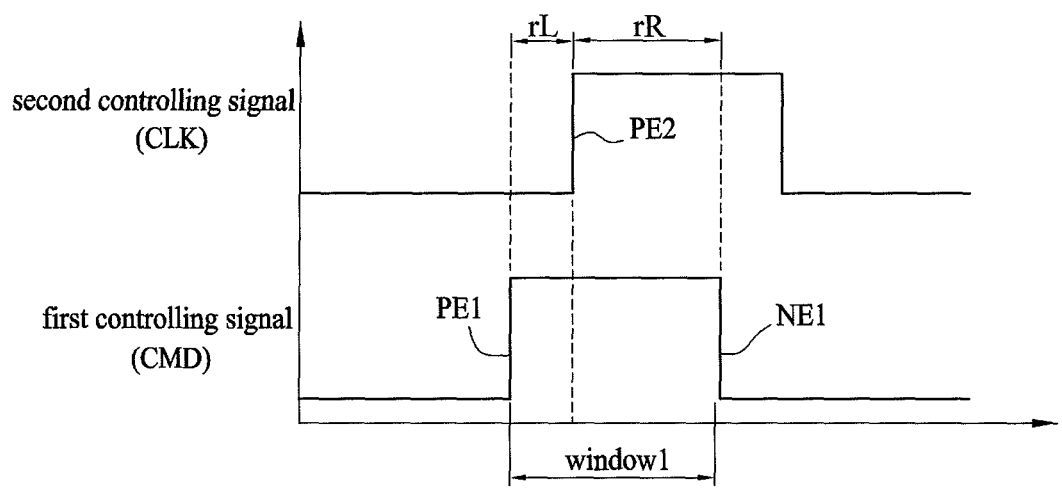
FIG. 4 is a schematic diagram showing the signal wave of the two controlling signals when a phase range test is performed in an embodiment of the invention.

In another aspect, when all the active windows of the controlling signals are larger than the predetermined window, the memory controlling method in the embodiment of the invention performs step S108, which is performing the phase range test between two of the controlling signals. As shown in FIG. 2 to FIG. 4, FIG. 4 is a schematic diagram showing the signal wave of the phase range test in the two controlling signals in an embodiment of the invention. In the embodiment, step S108a may be performed to test the controlling signals. For example, the controlling signals herein may be a first controlling signal (such as CMD) and a second controlling signal (such as CLK), and the first controlling signal has a positive edge PE1 and the negative edge NE1, the second controlling signal has a positive edge PE2, and the active window is the interval between the positive edge and the negative edge of the controlling signal, just as the active window window 1 in the first controlling signal.

In the embodiment in FIG. 4, in step S108a, the left phase limit rL of the second controlling signal corresponding to the active window window 1 of the first controlling signal is obtained according to the time interval between the positive edge PE2 of the second controlling signal and the positive edge PE1 of the first controlling signal. At that moment, the right phase limit rR of the second controlling signal corresponding to the active window window 1 of the first controlling signal is obtained according to the time interval between the positive edge PE2 of the second controlling signal and the negative edge NE1 of the first controlling signal. Then, if the left phase limit rL equals to the right phase limit rR, a test result that the phase range test is passed is generated. On the contrary, if the left phase limit rL does not equal to the right phase limit rR, the test result that the phase range test is not passed is generated.

Then, as shown in FIG. 1, in the memory controlling method in the embodiment of the invention, step S110 is performed to determine whether the phase limit test is passed. In the embodiment, step S110 in FIG. 1 is achieved by step S110a in FIG. 2, which is determining whether the left phase limit rL equals the right phase limit rR. If the left phase limit rL equals to the right phase limit rR, step S114 is performed to load the adjusted controlling signal to drive the memory, thereby making the memory work stable.

If the left phase limit rL does not equal to the right phase limit rR, step S112 is performed to adjust the phase of the two controlling signals. The detailed adjustment herein is shown in FIG. 2. Firstly, step S112a is performed to compare the values of the left phase limit rL and the right phase limit rR. As shown in FIG. 4, if rL<rR, step S112b is performed to make the phase of the first controlling signal one unit advance, and it means to advance the phase of the first controlling signal relative to the second controlling signal. On the contrary, if rL>rR, step S112c is performed to delay the phase of the first controlling signal relative to the second controlling signal.

When the first controlling signal and the second controlling signal in step S112 are adjusted, step S108 is performed again to perform the phase range test on the first controlling signal and the second controlling signal to determine whether the first controlling signal and the second controlling signal pass the phase range test (whether the left phase limit rL equals to the right phase limit rR). If not, step S108 to step S112 is performed again until the controlling signals pass the phase range test.

As a result, to two controlling signals with function relationship, the triggering time point of the positive edge PE2 of the second controlling signal is certainly located at the center of the active window window 1 of the first controlling signal. Therefore, when the positive edge is triggered, the related controlling signal is switched. Consequently, the signals would not unstable due to the controlling signals with too close switching time. In addition, the phase range test is applied to the controlling signals of the CMD and the CLK, which is used as an example, in practical usage, the combinations of signals such as Write DQ, and Write DQS, Read DQ and Read DQS, CLK and Write DQS and CLK and Read DQS are also adapted to the invention.

In the above embodiment, the positive edge is triggered, and the invention is not limited thereto, in the memory controlling method in another embodiment, the negative edge also may be triggered. The biggest difference is that the left phase limit is obtained according to the time interval between the negative edge of the second controlling signal and the positive edge of the first controlling signal, and the right phase limit is obtained according to the time interval between the negative edge of the second controlling signal and the negative edge of the first controlling signal. Other details are similar to the embodiments above, which is not illustrated herein for concise purpose.

To sum up, the memory controlling method in the embodiment of the invention may be executed via the software or firmware stored in the BIOS. When the controlling signal is booted, the parameter or the phase is automatically adjusted according to the characters of the controlling signals of the memory (such as the range of the active window or the signal phase). As a result, when the computer system is booted, the memory is adjusted to be at the stable setting value according to the configuration. Consequently, the memory module can work stably, and the time for developing and manufacturing is also reduced.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A memory controlling method adapted to driving a memory, wherein the memory is driven by multiple controlling signals, and each of the controlling signals has an active window, respectively, the memory controlling method comprising the steps of:
   detecting an active window of each of the controlling signals of the memory;
   determining whether the active windows are larger than a predetermined window;
   performing a parameter adjustment on the controlling signals to adjust the active windows of the controlling signals if one of the active windows is smaller than the predetermined window;
   performing a phase range test between two of the controlling signals if the active windows are larger than the predetermined window;
   wherein the controlling signal includes a first controlling signal and a second controlling signal, the first controlling signal has a first positive edge and a negative edge, and the second controlling, signal has a second positive edge, the active window of the first controlling signal is between the first positive edge and the negative edge, and the phase range test comprises the steps of:
      obtaining a left phase limit of the second controlling signal corresponding to the active window of the first controlling signal according to a time interval between the second positive edge of the second controlling signal and the first positive edge of the first controlling signal;
      obtaining a right phase limit of the second controlling signal corresponding to the active window of the first controlling signal according to a time interval between the second positive edge of the second controlling signal and the negative edge of the first controlling signal;
      generating a test result that the phase range test relating to the second controlling signal corresponding to the active window of the first controlling signal is passed when the left phase limit equals to the right phase limit; and
      generating a test result that the phase range test relating to the second controlling signal corresponding to the active window of the first controlling signal is not passed when the left phase limit does not equal to the right phase limit;
   performing a phase adjustment on the controlling signals if the two of the controlling signals fails in the phase range test; and
   driving the memory according to the adjusted controlling signals.

2. The memory controlling method according to claim 1, wherein the parameter adjustment comprises the steps of:
   adjusting a signal driving strength of one of the controlling signals;
   testing whether the adjusted active windows are larger than the predetermined window; and
   adjusting and testing the signal driving strength of one of the controlling signals again if one of the active windows is smaller than the predetermined window.

3. The memory controlling method according to claim 1, wherein the memory has a working voltage configuration located in a specification range, and the parameter adjustment comprises the steps of:
   adjusting the working voltage configuration in the specification range;
   testing whether the adjusted active windows are larger than the predetermined window; and
   adjusting and testing the working voltage configuration in the specification range again if one of the active windows is smaller than the predetermined window.

4. The memory controlling method according to claim 3, wherein the working voltage configuration is one or a combination of a memory bus voltage parameter and a memory controller voltage parameter.

5. The memory controlling method according to claim 1, wherein the memory has multiple time parameters, and the parameter adjustment comprises the steps of:
   adjusting one of the time parameters of the memory; testing whether the adjusted active windows are larger than the predetermined window; and
   adjusting and testing one of the time parameters in the memory again if one of the active windows is smaller than the predetermined window.

6. The memory controlling method according to claim 5, wherein the time parameters comprises multiple memory delay parameters, and the memory delay parameters includes one or a combination of a clock cycle, a timing of row address strobe (RAS) to column address strobe (CAS) Delay parameter, a timing of RAS precharge parameter, and an active to RAS precharge delay.

7. The memory controlling method according to claim 1, wherein the controlling signals includes a first controlling signal and a second controlling signal, when the first controlling signal and the second controlling signal do not pass the phase range test, the phase adjustment comprises the steps of:
   delaying or advancing the first controlling signal relative to the second controlling signal; and
   performing the phase range test on the first controlling signal and the second controlling signal;
   determining whether the first controlling signal and the second controlling signal pass the phase range test, and delaying or advancing the first controlling signal relative to the second controlling signal and performing the phase range test again if the first controlling signal and the second controlling signal do not pass the phase range test.

8. The memory controlling method according to claim 1, wherein the controlling signal comprises one or a combination of a command controlling signal, a clock controlling signal, a reading controlling signal, a reading command controlling signal, a writing controlling signal and a read/write clock controlling signal.

9. A memory controlling method adapted to driving a memory, wherein the memory is driven by multiple controlling signals, and each of the controlling signals has an active window, respectively, the memory controlling method comprising the steps of:
   detecting an active window of each of the controlling signals of the memory;
   determining whether the active windows are larger than a predetermined window;

performing a parameter adjustment on the controlling signals to adjust the active windows of the controlling signals if one of the active windows is smaller than the predetermined window;

performing a phase range test between two of the controlling signals if the active windows are larger than the predetermined window;

wherein the controlling signal includes a first controlling signal and a second controlling signal, the first controlling signal has a positive edge and a first negative edge, and the second controlling signal has a second negative edge, the active window of the first controlling signal is between the positive edge and the first negative edge, and the phase range test comprises the steps of:

obtaining a left phase limit of the second controlling signal corresponding to the active window of the first controlling signal according to a time interval between the second negative edge of the second controlling signal and the positive edge of the first controlling signal;

obtaining a right phase limit of the second controlling signal corresponding to the active window of the first controlling signal according to a time interval between the second negative edge of the second controlling signal and the first negative edge of the first controlling signal;

generating a test result that the phase range test relating to the second controlling signal corresponding to the active window of the first controlling signal is passed when the left phase limit equals to the right phase limit; and generating a test result that the phase range test relating to the second controlling signal corresponding to the active window of the first controlling signal is not passed when the left phase limit does not equal to the right phase limit;

performing a phase adjustment on the controlling signals if the two of the controlling signals fails in the phase range test; and driving the memory according to the adjusted controlling signals.

10. The memory controlling method according to claim 9, wherein the parameter adjustment comprises the steps of:

adjusting a signal driving strength of one of the controlling signals;

testing whether the adjusted active windows are larger than the predetermined window; and adjusting and testing the signal driving strength of one of the controlling signals again if one of the active windows is smaller than the predetermined window.

11. The memory controlling method according to claim 9, wherein the memory has a working voltage configuration located in a specification range, and the parameter adjustment comprises the steps of:

adjusting the working voltage configuration in the specification range;

testing whether the adjusted active windows are larger than the predetermined window; and adjusting and testing the working voltage configuration in the specification range again if one of the active windows is smaller than the predetermined window.

12. The memory controlling method according to claim 11, wherein the working voltage configuration is one or a combination of a memory bus voltage parameter and a memory controller voltage parameter.

13. The memory controlling method according to claim 9, wherein the memory has multiple time parameters, and the parameter adjustment comprises the steps of:

adjusting one of the time parameters of the memory; testing whether the adjusted active windows are larger than the predetermined window; and adjusting and testing one of the time parameters in the memory again if one of the active windows is smaller than the predetermined window.

14. The memory controlling method according to claim 13, wherein the time parameters comprises multiple memory delay parameters, and the memory delay parameters includes one or a combination of a clock cycle, a timing of row address strobe (RAS) to column address strobe (CAS) Delay parameter, a timing of RAS precharge parameter, and an active to RAS precharge delay.

15. The memory controlling method according to claim 9, wherein the controlling signals includes a first controlling signal and a second controlling signal, when the first controlling signal and the second controlling signal do not pass the phase range test, the phase adjustment comprises the steps of:

delaying or advancing the first controlling signal relative to the second controlling signal; and performing the phase range test on the first controlling signal and the second controlling signal;

determining whether the first controlling signal and the second controlling signal pass the phase range test, and delaying or advancing the first controlling signal relative to the second controlling signal and performing the phase range test again if the first controlling signal and the second controlling signal do not pass the phase range test.

16. The memory controlling method according to claim 9, wherein the controlling signal comprises one or a combination of a command controlling signal, a clock controlling signal, a reading controlling signal, a reading command controlling signal, a writing controlling signal and a read/write clock controlling signal.

* * * * *